(12) United States Patent
Shinohara et al.

(10) Patent No.: US 10,121,756 B2
(45) Date of Patent: Nov. 6, 2018

(54) ANISOTROPIC CONDUCTIVE FILM AND CONNECTION STRUCTURE

(71) Applicant: DEXERIALS CORPORATION, Tokyo (JP)

(72) Inventors: Seiichiro Shinohara, Kanuma (JP); Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/316,649

(22) PCT Filed: May 8, 2015

(86) PCT No.: PCT/JP2015/063297
§ 371 (c)(1),
(2) Date: Dec. 6, 2016

(87) PCT Pub. No.: WO2016/002336
PCT Pub. Date: Jan. 7, 2016

(65) Prior Publication Data
US 2017/0162529 A1 Jun. 8, 2017

(30) Foreign Application Priority Data
Jun. 30, 2014 (JP) ................................. 2014-135375

(51) Int. Cl.
*H01L 23/48* (2006.01)
*H01L 23/00* (2006.01)
*H05K 3/32* (2006.01)

(52) U.S. Cl.
CPC .............. *H01L 24/29* (2013.01); *H01L 24/83* (2013.01); *H05K 3/323* (2013.01);
(Continued)

(58) Field of Classification Search
CPC . H01L 24/83; H01L 24/29; H01L 2224/8312; H01L 2224/29499; H01L 2224/2929; H05K 3/323
See application file for complete search history.

(56) References Cited

U.S. PATENT DOCUMENTS

| | | | |
|---|---|---|---|
| 2006/0249301 A1* | 11/2006 | Meth ........................ | H01R 4/04 174/259 |
| 2010/0101700 A1* | 4/2010 | Liang ...................... | B32B 27/16 156/73.1 |

(Continued)

FOREIGN PATENT DOCUMENTS

| | | |
|---|---|---|
| CN | 102232096 A | 11/2011 |
| CN | 103709955 A | 4/2014 |

(Continued)

OTHER PUBLICATIONS

Aug. 4, 2015 International Search Report issued in International Patent Application No. PCT/JP2015/063297.
(Continued)

Primary Examiner — Stephen Bradley
(74) Attorney, Agent, or Firm — Oliff PLC (57) ABSTRACT

In order to easily inspect a dispersion state of conductive particles in such an anisotropic conductive film that the conductive particles are dispersed even at high density, linear lines including no conductive particle in a plan view of an anisotropic conductive film including an insulating adhesive layer and conductive particles dispersed in the insulating adhesive layer are allowed to exist at predetermined intervals. Specifically, the conductive particles are disposed in a lattice so as to be arranged in a first arrangement direction and a second arrangement direction, and the disappearance lines are inclined relative to the first arrangement direction or the second arrangement direction.

15 Claims, 7 Drawing Sheets (52) U.S. Cl.
CPC .................. *H01L 2224/2929* (2013.01); *H01L 2224/29499* (2013.01); *H01L 2224/8312* (2013.01)

(56) References Cited

U.S. PATENT DOCUMENTS

| | | | |
|---|---|---|---|
| 2011/0170274 A1* | 7/2011 | Moriwaki | G02F 1/13452 361/783 |
| 2011/0223430 A1* | 9/2011 | Ishimatsu | C08L 33/24 428/426 |

FOREIGN PATENT DOCUMENTS

| | | |
|---|---|---|
| JP | H05-82199 A | 4/1993 |
| JP | H09-320345 A | 12/1997 |
| JP | 2007-080522 A | 3/2007 |
| JP | 4887700 B2 | 2/2012 |
| JP | 2014-074139 A | 4/2014 |

OTHER PUBLICATIONS

Aug. 4, 2015 Written Opinion issued in International Patent Application No. PCT/JP2015/063297.
Jan. 16, 2018 Office Action issued in Japanese Patent Application No. 2014-135375.
Jul. 3, 2018 Office Action issued in Chinese Patent Application No. 201580036022.6.

\* cited by examiner

ANISOTROPIC CONDUCTIVE FILM AND CONNECTION STRUCTURE

TECHNICAL FIELD

The present invention relates to an anisotropic conductive film, a connection method using the anisotropic conductive film, and a connection structure connected through the anisotropic conductive film.

BACKGROUND ART

An anisotropic conductive film has been widely used in mounting an electronic component such as an IC chip on a substrate. In recent years, highly-dense wirings have been required for a compact electronic device such as a cellular phone and a laptop computer. As a technique of applying the highly-dense wirings to the anisotropic conductive film, a technique of evenly arranging conductive particles in a matrix on an insulating adhesive layer of the anisotropic conductive film has been known.

However, even when the conductive particles are evenly arranged, a problem such as uneven connection resistance arises. This is because conductive particles that are disposed on edges of terminals flow off into a space by melting an insulation adhesive, so that the conductive particles are unlikely to be held between the upper and lower terminals.

As a countermeasure against this problem, an anisotropic conductive film has been proposed (Patent Literature 1). In the anisotropic conductive film, conductive particles are arranged in a lattice, a first arrangement direction of the conductive particles is a longitudinal direction of the anisotropic conductive film, and a second arrangement direction intersecting the first arrangement direction is inclined at 5° or more and 15° or less relative to a direction orthogonal to the longitudinal direction of the anisotropic conductive film.

CITATION LIST

Patent Literature

Patent Literature 1: Japanese Patent No. 4887700

SUMMARY OF INVENTION

Technical Problem

However, when the size of a bump of an electronic component connected using the anisotropic conductive film is decreased to increase the density of the conductive particles arranged in a lattice (the number of the conductive particles per unit area), there are problems in which inspection of the arrangement state of the conductive particles takes time and the accuracy of the inspection decreases.

Therefore, an object of the present invention is to facilitate inspection of the dispersion state of conductive particles in an anisotropic conductive film even when the conductive particles are dispersed therein at high density.

Solution to Problem

The present inventors have found that when a linear line including no conductive particle in a plan view is allowed to be observed in such an anisotropic conductive film that the conductive particles are dispersed in a lattice or randomly dispersed in an insulating adhesive layer, the dispersion state of the conductive particles can be easily inspected using the line. Thus, the present invention has been completed.

Specifically, the present invention provides an anisotropic conductive film including an insulating adhesive layer and conductive particles dispersed in the insulating adhesive layer, wherein linear lines including no conductive particle in a plan view (hereinafter referred to as disappearance lines) exist at predetermined intervals.

In particular, the present invention provides an aspect of the anisotropic conductive film, wherein the conductive particles are disposed in a lattice by arranging them in a first arrangement direction and a second arrangement direction, and the disappearance lines are inclined relative to the first arrangement direction or the second arrangement direction.

Further, the present invention provides a connection method for connecting a connecting terminal of a first electronic component to a connecting terminal of a second electronic component using the anisotropic conductive film of this aspect by anisotropic conductive connection, the connection method including matching a direction substantially orthogonal to the first arrangement direction or the second arrangement direction of the anisotropic conductive film to a longitudinal direction of the connecting terminal of the first electronic component or the second electronic component.

Herein, the substantially orthogonal direction includes not only a direction exactly orthogonal to the first arrangement direction but also a range of a gap caused by mounting an electronic component using the anisotropic conductive film. The range is generally within ±3° with respect to the direction orthogonal to the first arrangement direction.

The present invention further provides a connection structure in which the connecting terminal of the first electronic component and the connecting terminal of the second electronic component are connected by anisotropic conductive connection using the above-described anisotropic conductive film.

Advantageous Effects of Invention

Since the anisotropic conductive film of the present invention has the disappearance lines, a visual field can be scanned on the basis of the disappearance lines during inspection of the arrangement state by visual inspection or image inspection of the anisotropic conductive film. Therefore, inspection of the whole anisotropic conductive film can be made easy without any omission. In addition, a position where a defect occurs is easily specified by scanning the visual field on the basis of the disappearance lines. For this reason, an oversight of the defect such as aggregation and lack of the conductive particles in the anisotropic conductive film is suppressed, and it is easy to highly maintain the quality of the anisotropic conductive film.

Since the anisotropic conductive film has the disappearance lines, the occupancy area of the conductive particles at a plane visual field is nondense. Therefore, macroscopic observation is made easy. Specifically, even when the conductive particles are evenly dispersed so as to be arranged in a lattice, the conductive particles are easily grasped as an assembly group of the particles due to the presence of the disappearance lines. Therefore, the quality of regularity that forms the group can be simply grasped. Accordingly, even when the number density of the conductive particles is low or high, the oversight of the defect such as aggregation and lack of the conductive particles can be suppressed.

According to the anisotropic conductive film of the present invention, the regularity of a region including no conductive particle is found in advance even after anisotropic conductive connection using the anisotropic conductive film. Therefore, a state in which the conductive particles are trapped by a bump is easy to be grasped.

DESCRIPTION OF EMBODIMENTS

Hereinafter, the present invention will be described in detail with reference to the drawings. In the drawings, the same reference numerals denote the same or similar elements.

Figure 1:
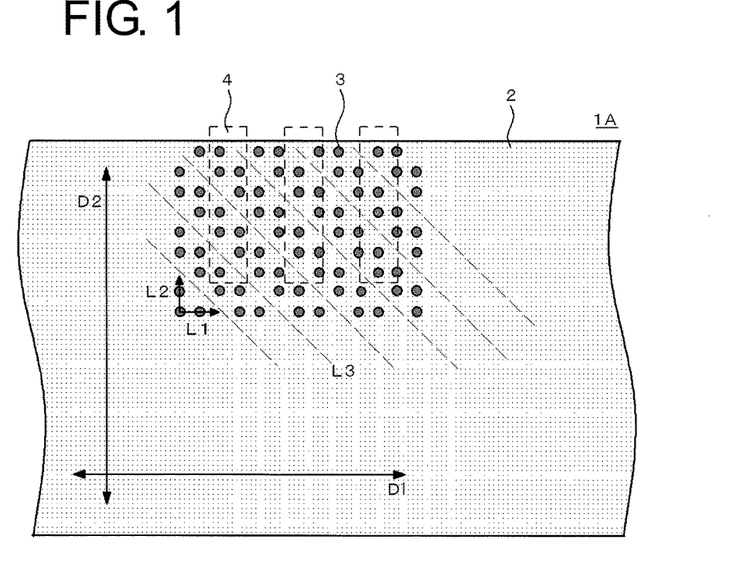
FIG. 1 is a plan view of an anisotropic conductive film 1A of an embodiment.
Figure 2:
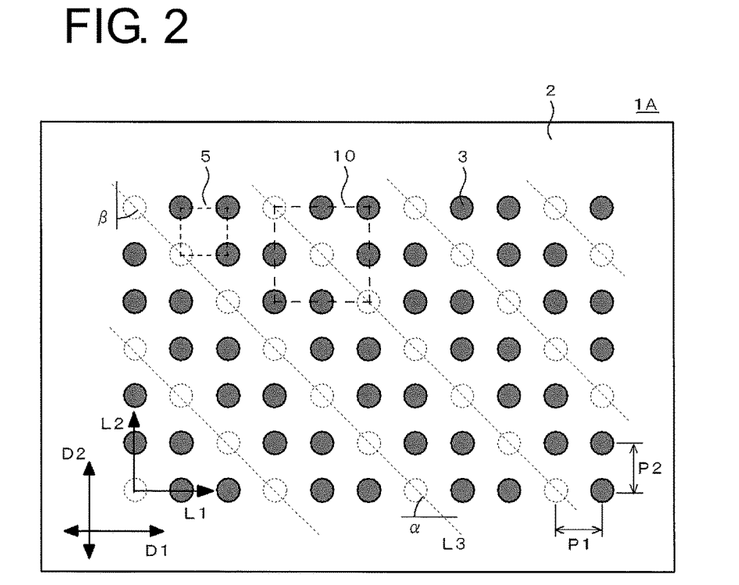
FIG. 2 is an arrangement diagram of conductive particles in the anisotropic conductive film 1A of the embodiment.
Figure 3:
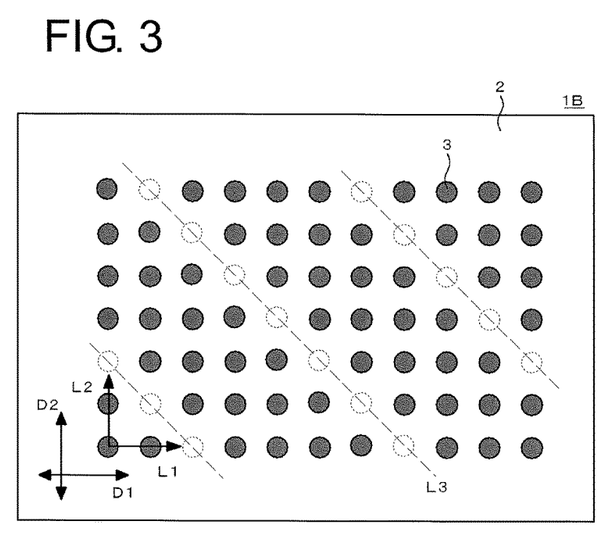
FIG. 3 is an arrangement diagram of conductive particles in an anisotropic conductive film 1B of an embodiment.

FIG. 1 is a plan view of an anisotropic conductive film 1A of an embodiment of the present invention. FIG. 2 is an arrangement diagram of conductive particles in the anisotropic conductive film 1A.

This anisotropic conductive film 1A has an insulating adhesive layer 2, and conductive particles 3 that are fixed on the insulating adhesive layer 2 while being arranged in a lattice. Specifically, this anisotropic conductive film 1A is obtained by slitting an elongated anisotropic conductive film in a band shape. In the anisotropic conductive film 1A, the conductive particles 3 are arranged in a first arrangement direction L1 that is parallel to a longitudinal direction D1 of the anisotropic conductive film 1A formed in a band shape at a pitch P1, and in a second arrangement direction L2 that is parallel to a width direction D2 of the anisotropic conductive film 1A orthogonal to the longitudinal direction D1 of the anisotropic conductive film 1A, i.e., that is orthogonal to the first arrangement direction L1, at a pitch P2. The conductive particles 3 thus form a tetragonal lattice.

In the anisotropic conductive film 1A, disappearance lines L3 are formed by the conductive particles 3 not existing at lattice points on lines that are inclined relative to the first arrangement direction L1 or the second arrangement direction L2 of the conductive particles 3. In this case, the disappearance lines L3 are formed so as to be inclined at an angle of inclination α to the first arrangement direction L1 or at an angle of inclination β to the second arrangement direction L2. It is preferable that the disappearance lines L3 be formed in parallel to each other at predetermined intervals.

The anisotropic conductive film 1A has the disappearance lines L3. Thus, when the arrangement state of the conductive particles 3 in the anisotropic conductive film 1A is inspected by visual inspection or image inspection, a visual field 10 where the disappearance lines L3 serve as a diagonal line is set as illustrated in FIG. 2. In this state, the visual field 10 can be scanned so that a predetermined angle between the visual field 10 and the disappearance line L3 is maintained while the number and the arrangement of the conductive particles 3 within the visual field 10 are examined. Therefore, the whole surface of the anisotropic conductive film 1A is easily scanned using the visual field 10 without any omission.

In the visual inspection, the symmetry of arrangement of the conductive particles 3 with respect to each of the disappearance lines L3 as a symmetry axis at the visual field 10 is easy to be recognized. Therefore, a defect such as aggregation and lack of the conductive particles 3 is easily found. Accordingly, it is easy to highly maintain the quality of the anisotropic conductive film 1A due to the presence of the disappearance lines L3. Furthermore, a time required for inspection of a product can be shortened, and the productivity of the product is improved.

In anisotropic conductive connection on a production line of electronic devices, a short-side direction of a connecting terminal 4 is usually disposed along the longitudinal direction D1 of the anisotropic conductive film 1A as illustrated in FIG. 1. For anisotropic conductive connection of the connecting terminals 4 formed at a fine pitch, it is preferable that the angle of inclination α of the disappearance lines L3 be small. For example, like film-on-glass (FOG) joint in which a glass substrate for a display of a television is jointed to a flexible printed circuit (FPC), it is preferable that the angle of inclination α be 15 to 75° when a connection surface of the connecting terminal 4 has a size with a width of 8 to 200 μm and a length of 1,500 μm or less.

In a method of adjusting the angle of inclination α, when the disappearance lines L3 are formed so as to pass through a diagonal of a unit lattice 5 of a basic arrangement of the conductive particles 3 (i.e., an arrangement including no disappearance line L3), as illustrated in FIG. 2, the angle of inclination α can be adjusted depending on the sizes of the pitch P1 in the first arrangement direction L1 and the pitch P2 in the second arrangement direction L2 of the conductive particles 3. For example, from the viewpoint of the angle of inclination α that is made smaller than the angle of inclination β formed by the width direction L2 of the anisotropic conductive film 1A and the disappearance lines L3, the pitch P1 in the first arrangement direction L1 is made longer than the pitch P2 in the second arrangement direction L2.

Figure 4:
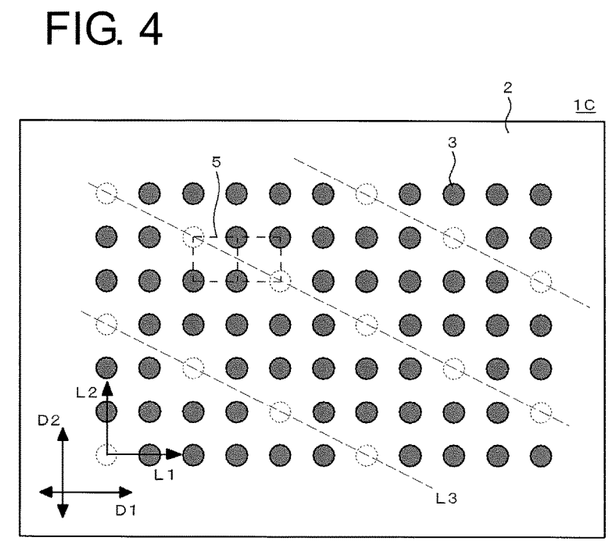
FIG. 4 is an arrangement diagram of conductive particles in an anisotropic conductive film 1C of an embodiment.

When the angle of inclination α is decreased, the disappearance lines L3 may be each formed so as to pass through a diagonal of two unit lattices 5 linked in the first arrangement direction L1, like an anisotropic conductive film 1C illustrated in FIG. 4.

Figure 5:
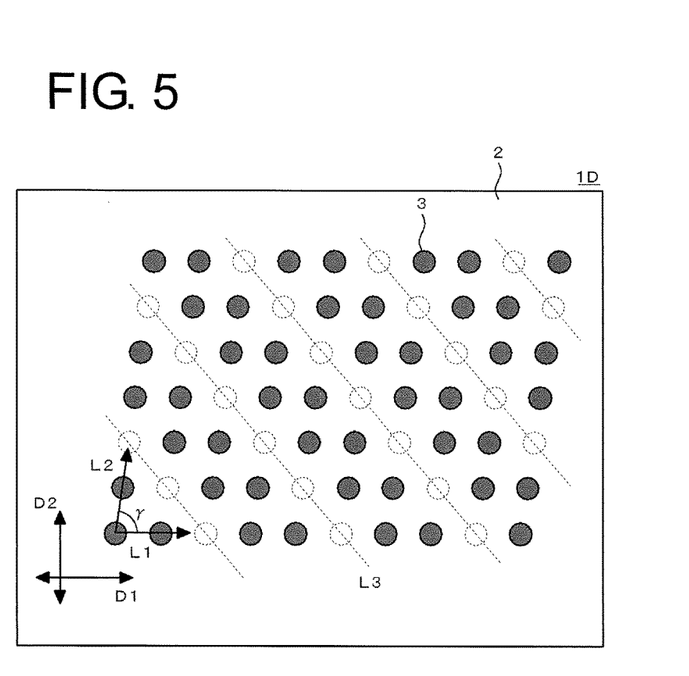
FIG. 5 is an arrangement diagram of conductive particles in an anisotropic conductive film 1D of an embodiment.

In the present invention, the basic arrangement of the conductive particles 3 and the direction of the disappearance lines L3 are not particularly limited. For example, the second arrangement direction L2 may be inclined relative to the first arrangement direction L1 of the conductive particles 3, like an anisotropic conductive film 1D illustrated in FIG. 5. In this case, an angle γ formed by the second arrangement direction L2 and the first arrangement direction L1 is preferably 15 to 75°, more preferably 18 to 72°, and yet more preferably 20 to 70°.

Figure 6A:
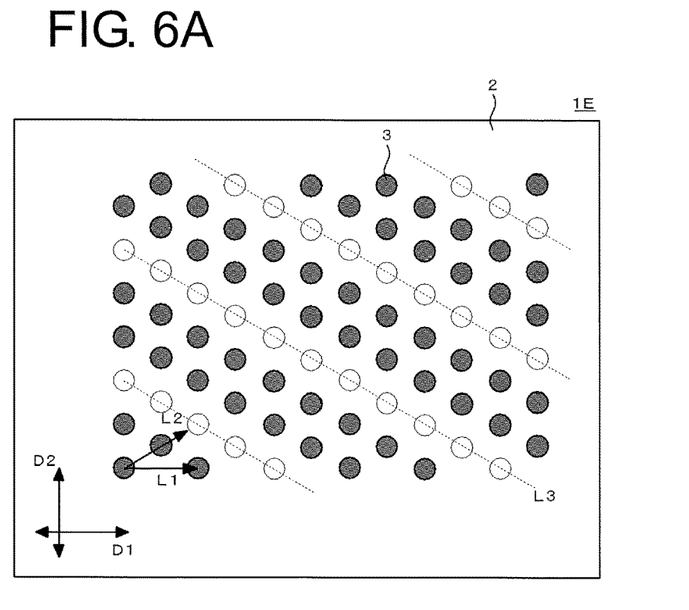
FIG. 6A is an arrangement diagram of conductive particles in an anisotropic conductive film 1E of an embodiment.
Figure 6B:
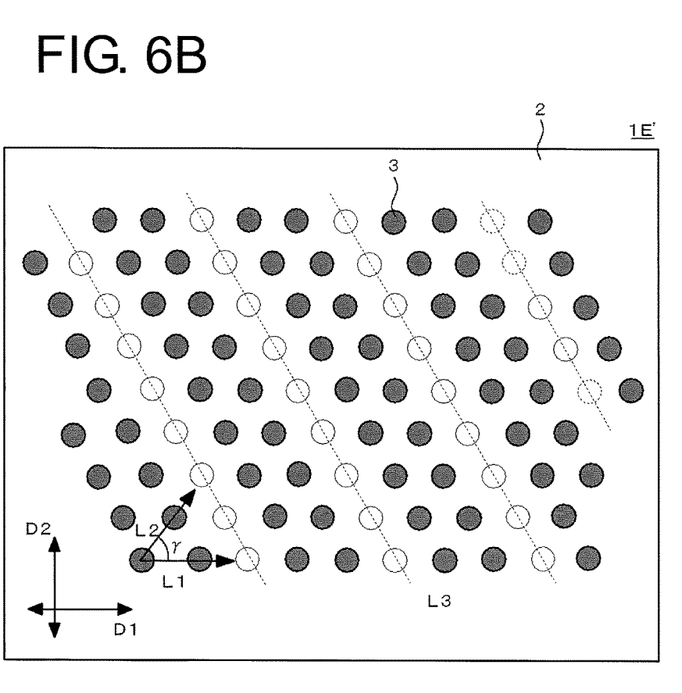
FIG. 6B is an arrangement diagram of conductive particles in an anisotropic conductive film 1E' of an embodiment.

Like anisotropic conductive films 1E and 1E' shown in FIGS. 6A and 6B, respectively, the basic arrangement of the conductive particles 3 may be a hexagonal lattice, and the disappearance lines L3 inclined relative to the first arrangement direction L1 may be formed. The direction of the basic arrangement of the conductive particles 3 may be any direction relative to the longitudinal direction D1 of the anisotropic conductive film.

In performing anisotropic conductive connection of a rectangular connecting terminal (bump) using the anisotropic conductive film 1D when the second arrangement direction L2 is inclined relative to the first arrangement direction L1, suppose the case where the longitudinal direction of the rectangular connecting terminal 4 is matched to the direction orthogonal to the first arrangement direction L1 (i.e., the short-side direction of the connecting terminal 4 is matched to the first arrangement direction L1), as illustrated in FIG. 1. In this case, the number of conductive particles that are disposed on an edge of the connecting terminal 4 and cannot contribute to connection by flowing into an insulating resin during the anisotropic conductive connection can be decreased. Therefore, when a rectangular region used for the anisotropic conductive connection is within the surface of the anisotropic conductive film 1A, the number of conductive particles 3 that contribute to conduction can be sufficiently secured.

Figure 7:
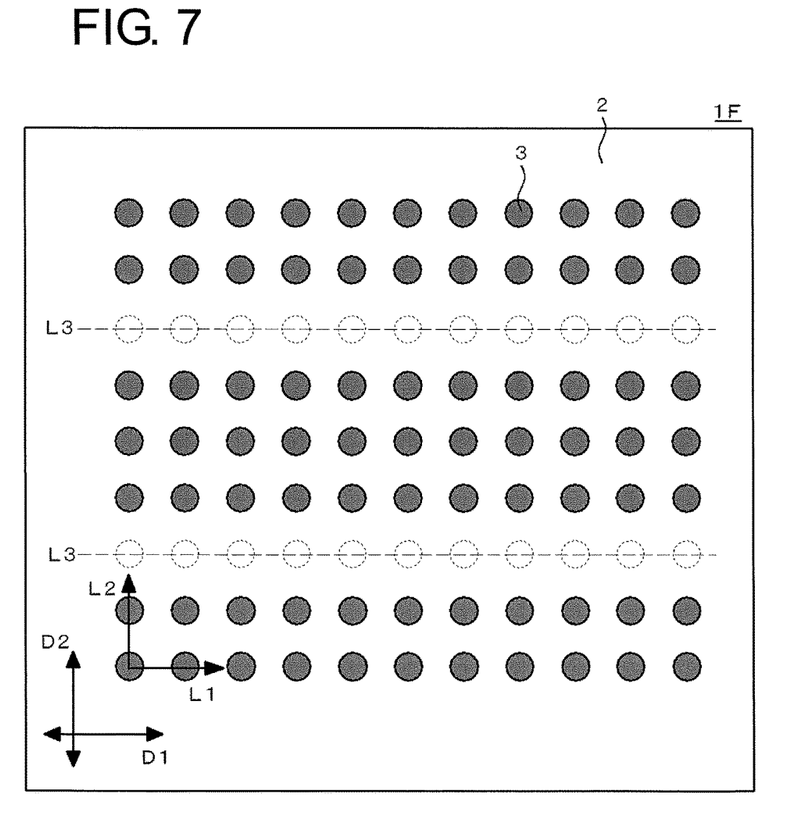
FIG. 7 is an arrangement diagram of conductive particles in an anisotropic conductive film 1F of an embodiment.

Like an anisotropic conductive film 1F illustrated in FIG. 7, the disappearance lines L3 may be formed in parallel to the first arrangement direction L1 of the conductive particles 3, or similarly formed in parallel to the second arrangement direction L2 of the conductive particles 3. From the viewpoints of the matters in which the trapping performance of the conductive particles by a bump is improved and a state in which the conductive particles are trapped by the bump after the anisotropic conductive connection is easily confirmed, it is preferable that the disappearance lines L3 be formed obliquely to the first arrangement direction L1 or the second arrangement direction L2 of the conductive particles 3. From the viewpoint of easy inspection during production of the film and, accordingly, an increased yield, it is preferable that the disappearance lines L3 be formed in parallel to the first arrangement direction L1 or the second arrangement direction L2.

Figure 8:
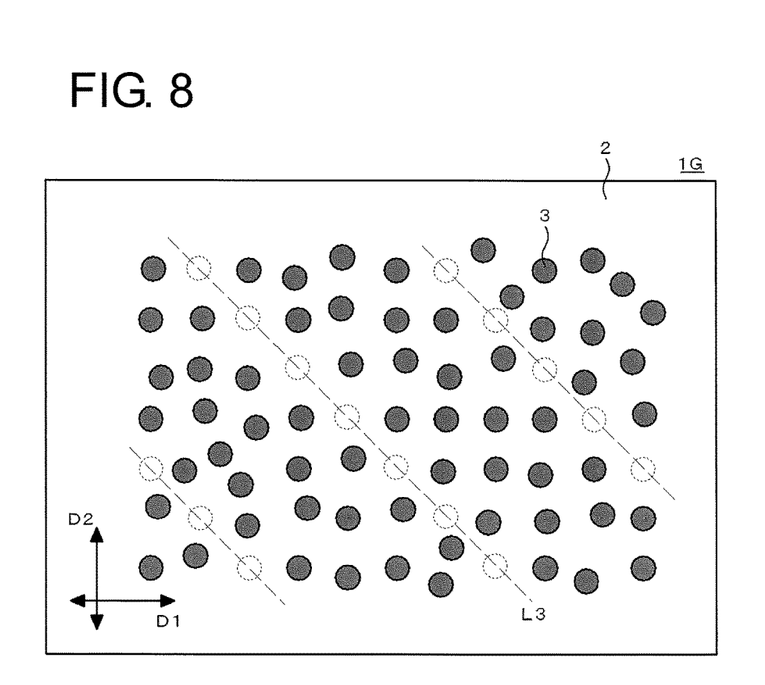
FIG. 8 is an arrangement diagram of conductive particles in an anisotropic conductive film 1G of an embodiment.
Figure 9:
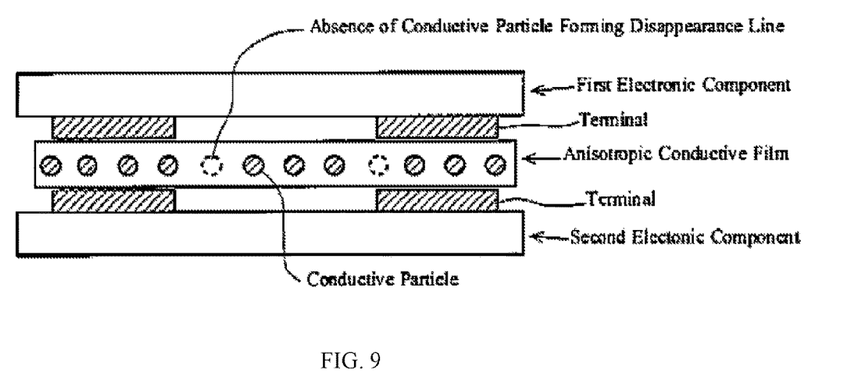
FIG. 9 is a side view of a connection between electronic components using an anisotropic conductive film of embodiments herein.

In the conductive particles 3 randomly dispersed like those in an anisotropic conductive film 1G illustrated in FIG. 8, it may be configured such that the disappearance lines L3 can be observed as linear regions including no conductive particle 3.

A configuration of the conductive particles 3 themselves, and a layer configuration and a constituent resin of the insulating adhesive layer 2 are not particularly limited, and the anisotropic conductive film of the present invention can have various aspects.

For example, as the conductive particles 3, conductive particles used in a publicly known anisotropic conductive film can be appropriately selected and used. Examples thereof may include particles of metal such as nickel, cobalt, silver, copper, gold, and palladium, and metal-coating resin particles. Two or more kinds thereof may be used in combination.

The particle diameter of the conductive particles 3 is preferably 1 to 50 µm, and more preferably 1 to 20 µm in terms of prevention of short circuit and stability of joint between electrodes.

When the conductive particles 3 are arranged in a lattice, the pitch in the first arrangement direction L1 and the pitch in the second arrangement direction L2 of the conductive particles 3 are each preferably 0.5 to 128 times the particle diameter of the conductive particles 3, more preferably 0.8 to 64 times, and further preferably 1.2 to 32 times. When the pitches are too short, short circuit is likely to occur during connection between terminals using the anisotropic conductive film. In contrast, when they are too long, the number of conductive particles trapped between the terminals is insufficient.

The density of the conductive particles 3 is preferably 100 to 100,000 particles/mm$^2$, more preferably 200 to 80,000 particles/mm$^2$, and particularly preferably 300 to 50,000 particles/mm$^2$. The density of the particles is appropriately adjusted depending on the particle diameter and the arrangement direction of the conductive particles 3.

As the insulating adhesive layer 2, an insulating resin layer used in the publicly known anisotropic conductive film can be appropriately adopted. For example, a photoradical polymerizable resin layer containing an acrylate compound and a photoradical polymerization initiator, a thermal radical polymerizable resin layer containing an acrylate compound and a thermal radical polymerization initiator, a thermal cationic polymerizable resin layer containing an epoxy compound and a thermal cationic polymerization initiator, a thermal anionic polymerizable resin layer containing an epoxy compound and a thermal anionic polymerization initiator, or the like, can be used. The resin layers may each be obtained by polymerization, if necessary. Further, the insulating adhesive layer 2 may be formed of a plurality of resin layers.

In a method of fixing the conductive particles 3 on the insulating adhesive layer 2 in the aforementioned array, a mold having hollows in the array of the conductive particles 3 is produced by a publicly known method such as machining, laser processing, and photolithography, and charged with the conductive particles. A composition for forming an insulating adhesive layer is then placed on the conductive particles, and cured to fix the conductive particles. The resultant product may be taken from the mold. The mold may be produced from a material having low rigidity.

Alternatively, a mold having hollows corresponding to the array of the conductive particles 3 that include no disappearance line L3 may be produced. A tape corresponding to each of the disappearance lines L3 may be attached to a surface of the mold to close the hollows at parts corresponding to the disappearance lines L3. Subsequently, the mold may be charged with the conductive particles 3, and then, as described above, the conductive particles 3 may be fixed on the insulating adhesive layer using the composition for forming an insulating adhesive layer.

Furthermore, in order to dispose the conductive particles 3 on the insulating adhesive layer 2 in the aforementioned array, a member having through holes in a predetermined array may be provided on a layer of the composition for forming an insulating adhesive layer, and the conductive particles 3 may be supplied over the member, and allowed to pass through the through holes.

When the conductive particles 3 are arranged using the member having through holes by passing the conductive particles 3 through the through holes, a member having through holes corresponding to the array of the conductive particles 3 that include no disappearance line L3 may be produced as the member having the through holes. The through holes of the member may be closed with a tape corresponding to each of the disappearance lines L3, and the conductive particles 3 may be supplied over the member.

When a connecting terminal of a first electronic component such as an IC chip and an IC module and a connecting terminal of a second electronic component such as a flexible substrate and a glass substrate are connected by anisotropic conductive connection using the anisotropic conductive film in which the conductive particles are arranged in a lattice and the disappearance lines are inclined to the first arrangement direction or the second arrangement direction in the present invention, the first arrangement direction L1 or the second arrangement direction L2 of the conductive particles 3 are matched to the longitudinal direction D1 of the anisotropic conductive film, and the direction substantially orthogonal to the first arrangement direction L1 or the second arrangement direction L2 is matched to the longitudinal direction of the connecting terminal 4 of the first electronic component or the second electronic component, as illustrated in FIG. 1. Thus, the number of trapped conductive particles 3 by the connecting terminal 4 can be sufficiently increased.

According to the present invention, the array of the conductive particles in the connection structure in which the first electronic component and the second electronic component are connected by anisotropic conductive connection can be easily confirmed using the disappearance lines as indications. The present invention also involves such a connection structure.

EXAMPLES

Hereinafter, the present invention will be described specifically on the basis of Examples.

Examples 1 to 6 and Comparative Examples 1 to 3

As shown in Table 1, in Examples 1 to 6 and Comparative Examples 2 and 3, anisotropic conductive films having conductive particles in an array of FIG. 2 (tetragonal lattice) or FIG. 6A (hexagonal lattice) were produced using the conductive particles and resins shown in Table 1. In this case, a pitch P1 in a first arrangement direction L1 and a pitch P2 in a second arrangement direction L2 of the conductive particles each had a size shown in Table 1.

In Comparative Example 1, the conductive particles were randomly disposed.

Specifically, a mixed solution of an insulating resin containing a thermoplastic resin, a thermosetting resin, and a latent curing agent at each composition of Table 1 was prepared. This mixed solution was applied to a PET film having a film thickness of 50 μm, and dried in an oven at 80° C. for 5 minutes, to form an adhesive layer having a thickness of 20 μm on the PET film.

On the other hand, a metal mold having convex portions in a pattern corresponding to each arrangement of the conductive particles shown in Table 1 was produced. Pellets of a publicly known transparent resin were molten, poured into the metal mold, cooled, and cured to form a resin mold that had concave portions in the arrangement pattern shown in Table 1. The concave portions of this resin mold were charged with the conductive particles, and coated with the adhesive layer of the insulating resin, and the thermosetting resin contained in the insulating resin was cured by ultraviolet curing. The insulating resin was released from the mold to produce the anisotropic conductive film of each of Examples and Comparative Examples.

In Comparative Example 1, the conductive particles were dispersed in a solvent having low boiling point, and sprayed to be randomly disposed on the same plane.

Evaluation

The following evaluations (a) to (e) were performed.
(a) Presence or Absence of Disappearance Line In the anisotropic conductive film of each of Examples and Comparative Examples, any conductive particle was selected, and a region of 500 μm in the first arrangement direction×500 μm in the second arrangement direction on the conductive particle as a starting point was set. The lack of conductive particles at lattice points on an expected disappearance line was inspected by observation with a microscope (magnification: 100). At a portion that was not overlapped with this region, the same inspection was repeated ten times. In setting of the region to be observed, a region including a predetermined number of conductive particles (e.g., 30 particles×30 particles) may be set instead of setting of a region having a predetermined area.

A result of the observation in which the ratio of the number of conductive particles at the lattice points on the disappearance line and the number of the lattice points on the disappearance line is 5% or less is evaluated as the presence of the disappearance line. Another result is evaluated as the absence of the disappearance line. The results are shown in Table 1.
(b) Presence or Absence of Linked Particles The anisotropic conductive film of each of Examples and Comparative Examples was observed in the same manner as in (a). The presence or absence of linking of two or more conductive particles was inspected.

A result of the observation in which the ratio of the number of portion where two or more conductive particles are linked and the number of particles intended when there are not linked particles is 5% or less is evaluated as the absence of two or more linked particles. Another result is evaluated as the presence of two or more linked particles. A result in Comparative Example 1 was evaluated as the presence of two or more linked particles. Other results were evaluated as the absence. When the number of two linked particles is 5% or less of the total number of particles, no practical problem is caused.
(c) Number Concordance Rate The number of conductive particles contained in the region of 500 μm×500 μm including a disappearance line was counted by visual observation with a microscope. Subsequently, the number of conductive particles contained in the same region was counted by an image processing device (WinRoof: manufactured by MITANI CORPORATION). The number concordance rate was calculated by the following equation.

$$\text{Number concordance rate (\%)} = 100 - (|N1 - N2|/N1) \times 100$$

(N1: the number of conductive particles counted by visual observation
N2: the number of conductive particles counted by the image processing device)

The number concordance rate was evaluated from the value thereof in accordance with the following criteria. The results are shown in Table 1.
A: the number concordance rate is 97% or more
B: the number concordance rate is 92% or more and less than 97%
C: the number concordance rate is 85% or more and less than 92%
D: the number concordance rate is less than 85%

In practical terms, it is preferable that the number concordance rate be equal to or more than B.
(d) Initial Conduction Resistance The anisotropic conductive film of each of Examples and Comparative Examples was placed between an FPC for evaluation of initial conduction and conduction reliability and a glass substrate, and heated and pressurized (at 180° C.

and 3 MPa for 5 seconds) to obtain a connection body for each evaluation. The conduction resistance of this connection body for evaluation was measured. The results are shown in Table 1.

Herein, a pattern of terminals of the FPC for evaluation corresponded to a pattern of terminals of the glass substrate, and the sizes were as follows.

FPC for Evaluation
Polyimide substrate (thickness: 25 μm)
Wiring specification: Au-plated Cu wiring (height: 18 μm)
Wiring size: 25 μm in width×1,000 μm in length
Glass Substrate
Glass material: available from Corning Incorporated
Outside size: 15×70 mm
Thickness: 0.5 mm
Electrode: ITO wiring
(e) Conduction Reliability The connection body for evaluation having the FPC for evaluation of initial conduction resistance and the anisotropic conductive film of each of Examples and Comparative Examples were left in a constant temperature bath at a temperature of 85° C. and a humidity of 85% RH for 500 hours. After that, the conduction resistance was measured similarly to the measurement of initial conduction resistance. The results are shown in Table 1.

A conduction resistance of 5Ω or more was not preferred in terms of practical conduction stability of a connected electronic component.

As seen from Table 1, when a disappearance line is formed in an arrangement of conductive particles, the inspection efficiency of the conductive particles is improved.

In Comparative Example 1, noise was judged by the image processing device since the particles were randomly disposed. The inspection success rate is estimated to be significantly decreased.

REFERENCE SIGNS LIST 1A, 1B, 1C, 1D, 1E, 1E', 1F, 1G anisotropic conductive film
2 insulating adhesive layer
3 conductive particle
4 connecting terminal
5 unit lattice
10 visual field
D1 longitudinal direction of the anisotropic conductive film
D2 width direction of the anisotropic conductive film
L1 first arrangement direction
L2 second arrangement direction
L3 disappearance line
P1 pitch of the conductive particles in the first arrangement direction

TABLE 1

|  |  | Comparative Example 1 | Comparative Example 2 | Comparative Example 3 | Example 1 | Example 2 |
|---|---|---|---|---|---|---|
| Insulating Resin (part by mass) | Phenoxy Resin *1 | 60 | 60 | 60 | 60 | 60 |
|  | Epoxy Resin *2 | 40 | 40 | 40 | 40 | 40 |
|  | Cationic Curing Agent *3 | 2 | 2 | 2 | 2 | 2 |
| Conductive Particles *4 | Arrangement | None | Tetragonal Lattice | Hexagonal Lattice | Tetragonal Lattice | Tetragonal Lattice |
|  | Pitch In 1st Arrangement Direction (μm) | Random | 10 | 10 | 58 | 10 |
|  | Pitch In 2nd Arrangement Direction (μm) | Random | 10 | 8.7 | 58 | 10 |
|  | Particle Density (particles/mm²) | 10000 | 10000 | 10000 | 300 | 10000 |
| Evaluation | (a) Presence Or Absence Of Disappearance Line | Absence | Absence | Absence | Presence | Presence |
|  | (c) Number Concordance Rate | D | C | C | A | B |
|  | (d) Initial Conduction Resistance (Ω) | 0.2 | 0.2 | 0.2 | 0.2 | 0.2 |
|  | (e) Conduction Reliability (Ω) | Less than 5 | Less than 5 | Less than 5 | Less than 5 | Less than 5 |

|  |  | Example 3 | Example 4 | Example 5 | Example 6 |
|---|---|---|---|---|---|
| Insulating Resin (part by mass) | Phenoxy Resin *1 | 60 | 60 | 60 | 60 |
|  | Epoxy Resin *2 | 40 | 40 | 40 | 40 |
|  | Cationic Curing Agent *3 | 2 | 2 | 2 | 2 |
| Conductive Particles *4 | Arrangement | Tetragonal Lattice | Hexagonal Lattice | Hexagonal Lattice | Hexagonal Lattice |
|  | Pitch In 1st Arrangement Direction (μm) | 4.5 | 58 | 10 | 4.5 |
|  | Pitch In 2nd Arrangement Direction (μm) | 4.5 | 50.3 | 8.7 | 3.9 |
|  | Particle Density (particles/mm²) | 50000 | 300 | 10000 | 50000 |
| Evaluation | (a) Presence Or Absence Of Disappearance Line | Presence | Presence | Presence | Presence |
|  | (c) Number Concordance Rate | B | A | B | B |
|  | (d) Initial Conduction Resistance (Ω) | 0.2 | 0.2 | 0.2 | 0.2 |
|  | (e) Conduction Reliability (Ω) | Less than 5 | Less than 5 | Less than 5 | Less than 5 |

(Note)
*1: Nippon Steel Chemical Co., Ltd., YP-50 (Thermoplastic Resin)
*2: Mitsubishi Chemical Co., jER 828 (Thermosetting Resin)
*3: Sanshin Chemical Industry Co., Ltd., SI-60L (Latent Curing Agent)
*4: Sekisui Chemical Co., Ltd., AUL 703 (Ni/Au Plating Resin Particles, Average Particle Diameter: 3 μm)

P2 pitch of the conductive particles in the second arrangement direction
α angle of inclination
β angle of inclination
γ angle formed by the first arrangement direction L1 and the second arrangement direction L2

The invention claimed is:

1. An anisotropic conductive film comprising an insulating adhesive layer and conductive particles dispersed in the insulating adhesive layer, wherein
linear lines including no conductive particle in a plan view (hereinafter referred to as disappearance lines) exist at predetermined intervals,
the conductive particles are disposed in a lattice so as to be arranged in a first arrangement direction and a second arrangement direction, and
the disappearance lines are formed by an absence of conductive particles at lattice points within the lattice on lines that are (i) inclined relative to the first arrangement direction or the second arrangement direction or (ii) on lines parallel with the first arrangement direction or the second arrangement direction.

2. The anisotropic conductive film according to claim 1, wherein the anisotropic conductive film is formed in a band shape, and the disappearance lines are formed obliquely to a longitudinal direction of the anisotropic conductive film.

3. The anisotropic conductive film according to claim 2, wherein an angle formed by the longitudinal direction of the anisotropic conductive film and the disappearance line is smaller than an angle formed by a width direction of the anisotropic conductive film and the disappearance line.

4. The anisotropic conductive film according to claim 1, wherein the first arrangement direction of the conductive particles is parallel to the longitudinal direction of the anisotropic conductive film.

5. The anisotropic conductive film according to claim 1, wherein the first arrangement direction and the second arrangement direction of the conductive particles are orthogonal to each other.

6. The anisotropic conductive film according to claim 1, wherein the first arrangement direction and the second arrangement direction of the conductive particles intersect each other obliquely.

7. The anisotropic conductive film according to claim 1, wherein a density of the conductive particles is 100 to 100,000 particles/mm$^2$.

8. A connection method for connecting a connecting terminal of a first electronic component to a connecting terminal of a second electronic component using the anisotropic conductive film according to claim 1 by anisotropic conductive connection, the connection method comprising matching a direction substantially orthogonal to the first arrangement direction or the second arrangement direction of the anisotropic conductive film to a longitudinal direction of the connecting terminal of the first electronic component or the second electronic component.

9. The connection method according to claim 8, wherein a connection surface of the connecting terminal has a size with a width of 8 to 200 μm and a length of 1,500 μm or less.

10. A connection structure in which a connecting terminal of a first electronic component and a connecting terminal of a second electronic component are connected by anisotropic conductive connection using the anisotropic conductive film according to claim 1.

11. The anisotropic conductive film according to claim 1, wherein an arrangement pitch in the first arrangement direction and an arrangement pitch in the second arrangement direction of the conductive particles arranged in the lattice are 0.5 to 128 times a particle diameter of the conductive particles.

12. A method of manufacturing a connection structure, comprising connecting a connecting terminal of a first electronic component and a connecting terminal of a second electronic component by anisotropic conductive connection using the anisotropic conductive film according to claim 1.

13. An anisotropic conductive film comprising an insulating adhesive layer and conductive particles dispersed in the insulating adhesive layer, wherein
the conductive particles are distanced from each other to be disposed randomly in a plan view, except the conductive particles are not included in linear regions located obliquely relative to a longitudinal direction of the film so as to form disappearance lines including no conductive particles, wherein the disappearance lines are spaced apart from each other at regularly spaced predetermined intervals.

14. A connection structure in which a connecting terminal of a first electronic component and a connecting terminal of a second electronic component are connected by anisotropic conductive connection using the anisotropic conductive film according to claim 13.

15. A method of manufacturing a connection structure, comprising connecting a connecting terminal of a first electronic component and a connecting terminal of a second electronic component by anisotropic conductive connection using the anisotropic conductive film according to claim 13.

* * * * *